(12) United States Patent
Ho et al.

(10) Patent No.: US 6,674,165 B2
(45) Date of Patent: Jan. 6, 2004

(54) MOLD FOR A SEMICONDUCTOR CHIP (75) Inventors: Shu Chuen Ho, Singapore (SG); Teng Hock Kuah, Singapore (SG); Si Liang Lu, Singapore (SG); Srikanth Narasimulau, Singapore (SG); Charles J. Vath, III, Singapore (SG)

(73) Assignee: ASM Technology Singapore PTE LTD, Singapore (SG)

( * ) Notice: Subject to any disclaimer, the term of this patent is extended or adjusted under 35 U.S.C. 154(b) by 0 days.

(21) Appl. No.: 09/930,506

(22) Filed: Aug. 15, 2001

(65) Prior Publication Data

US 2003/0034555 A1 Feb. 20, 2003

(51) Int. Cl.⁷ ............................ H01L 23/04; H01L 23/02
(52) U.S. Cl. ........................................ 257/730; 257/678
(58) Field of Search .................................. 257/678, 730

(56) References Cited

U.S. PATENT DOCUMENTS 5,105,259 A * 4/1992 McShane et al. ........... 257/667
6,340,838 B1 * 1/2002 Chung et al. ................ 257/668

FOREIGN PATENT DOCUMENTS

JP        2000-164615 A  *  6/2000  ........... H01L/21/56

* cited by examiner

*Primary Examiner*—Allan R. Wilson
(74) *Attorney, Agent, or Firm*—Ostrolenk, Faber, Gerb & Soffen, LLP (57) ABSTRACT

A mold (1) for a semiconductor chip (9) has two mold halves (2, 3). One mold half (3) includes sealing means (10) adapted to exert a sealing pressure between a surface of the mold and a surface (18) of a substrate (8) located in the mold (1) during a molding operation.

13 Claims, 7 Drawing Sheets

LEADFRAME PATTERN

SINGLE GROOVE AT THE BOTTOM OF DIE-PAD

MOLD FOR A SEMICONDUCTOR CHIP

SUMMARY OF THE INVENTION

The invention relates to a mold, and especially, a mold for a semiconductor chip.

DESCRIPTION OF THE PRIOR ART

One recently developed semiconductor package is the quad, flat, no-lead package sometimes known as a QFN package. QFN packages generally fall into one of two categories, either matrix QFN or block QFN. In both types of package the substrate to which the die (or semiconductor chip) is attached is normally a metal lead frame.

Figure 1:
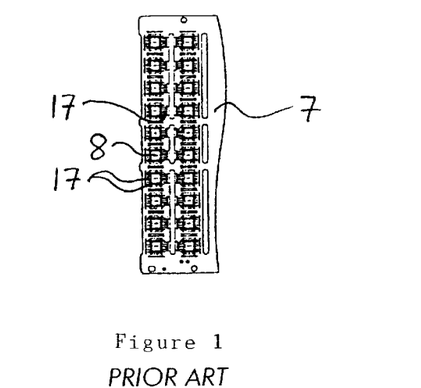
FIG. 1 is a plan view of a portion of a conventional lead frame for a matrix QFN package.

A typical lead frame 7 for a matrix QFN is shown in FIG. 1. For the matrix QFN package a single die is attached to each die pad 8 and during molding, each die is located within its own mold cavity. Hence, each die is individually encapsulated on the lead frame 7. After molding, the lead frame 7 is singulated by cutting the metal of the lead frame between each encapsulated die.

Figure 9:
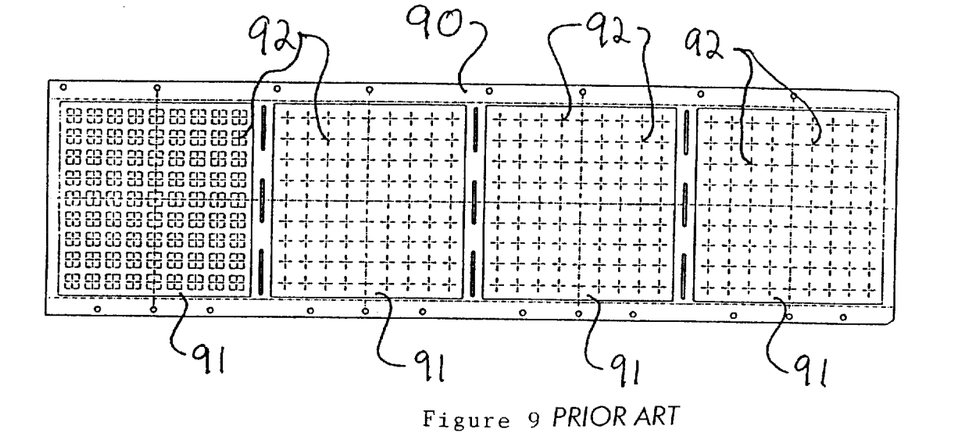
FIG. 9 is a plan view of a conventional lead frame for a block QFN package.

A typical lead frame 90 for a block QFN is shown in FIG. 9. The lead frame 90 has four separate blocks 91 and each block 91 has a square array of die pads to which a die is attached. During molding, all the dies on the die pads 92 in the same block 91 are located in the same mold cavity. Hence, all the dies in the same block are encapsulated in the same block of molding and singulation is performed by cutting through the lead frame 90 and the molding material between the dies in a block 91.

In both matrix and block QFN packages the overall size of the package is close to the size of the semiconductor chip located within the package. In addition, QFN packages are lead frame based packages and have an exposed die paddle. Hence, QFN packages enable good electrical performance and thermal characteristics, as the exposed die paddle can be used as a ground plane and a heat sink.

However, one problem with QFN packages, and indeed other semiconductor packages which are molded on only one side of the substrate, is the problem of epoxy flash seeping onto the other side of the lead frame during the molding operation.

SUMMARY OF THE INVENTION

In accordance with a first aspect of the present invention, there is provided a mold for a semiconductor chip comprising two mold halves, one mold half comprising sealing means adapted to exert a sealing pressure between a surface of the mold and a surface of a substrate located in the mold during a molding operation.

In accordance with a second aspect of the present invention, there is provided a method of molding material around a semiconductor chip mounted on a substrate, the method comprising inserting a substrate having a semiconductor chip mounted on a mounting portion of the substrate into a mold, closing the mold halves and applying a sealing pressure between a surface of the mold and a surface of the substrate to substantially prevent molding material entering between the surfaces of the mold and the substrate; injecting a molding material into the mold cavity to be molded around the semiconductor chip; after the molding operation has been completed, separating the mold halves and removing the sealing pressure between the surfaces of the mold and the substrate; and removing the molded semiconductor chip and substrate from the mold.

Preferably, the mold surface contacting the surface of the substrate is a compressible, and is typically elastically deformable. For example, the surface may comprise an elasticity deformable material, such as rubber or an elastomeric material.

In one example of the invention, the sealing means may comprise a suction means formed in the mold surface contacting the surface of the substrate. Typically, this may be provided by holes in the mold surface which are coupled to a vacuum generating device which when activated, causes the surface of the substrate to be sucked against the mold surface.

Preferably, the holes are arranged such that there is a substantially uniform sealing pressure across the surfaces.

In addition, or alternatively, the surface of the mold and/or the substrate may be configured such that when the mold halves are closed, the surface of the substrate is forced against the surface of the mold to generate the sealing pressure.

Preferably, the surface of the substrate to which the sealing pressure is applied is a surface of the mounting portion opposite the surface of the mounting portion on which the semiconductor chip is mounted.

In accordance with a third aspect of the present invention, there is provided a substrate for mounting a semiconductor chip thereon, the substrate comprising a mounting portion adapted to have a semiconductor chip mounted on a first surface of the mounting portion, and a second surface of the mounting portion, opposite the first portion, including a recess extending continuously around the second surface, and the recess being adjacent to and within the edge of the second surface.

Preferably, the substrate of the third aspect is for use with the mold of the first aspect and the method of molding of the second aspect.

Preferably, the substrate is a lead frame, and typically comprises a metal material.

Typically, the substrate is for a quad, flat, no-lead (QFN) semiconductor package.

Typically, there are two or more recesses extending around the second surface, one recess being closer to the edge of the second surface than the other recess. Preferably, the grooves are spaced apart from each other and typically, are substantially parallel.

BRIEF DESCRIPTION OF THE DRAWINGS

A mold and a substrate in accordance with the invention will now be described with reference to the accompanying drawings, in which.

DESCRIPTION OF THE PREFERRED EMBODIMENTS

FIG. 1 shows a plan view of a portion of a conventional lead frame 7 for a matrix QFN package. The lead frame 7 has a number of die paddles 8 to which a die is attached, in use.

Figure 2:
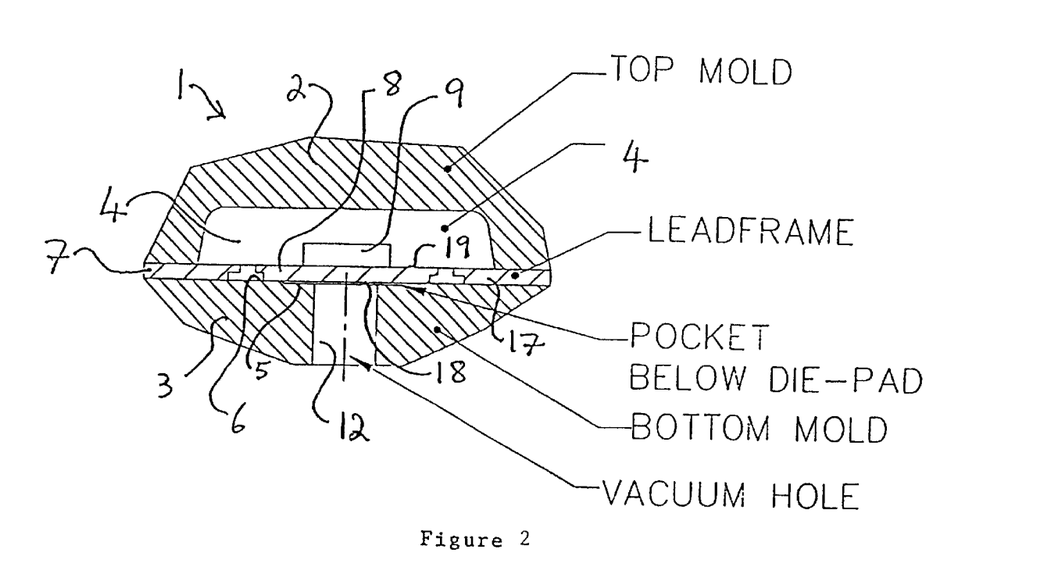
FIG. 2 is a cross-sectional view of a section of a first example of a mold for a matrix QFN package showing a lead frame and semiconductor chip located within the mold.

FIG. 2 is a cross-sectional view through a section of a mold 1 which comprises an upper mold half 2 and a lower mold half 3 which define a number of mold cavities 4 (only one shown). The lower mold half 3 includes a recess 5 which is in communication with a hole 12 formed in the lower mold half 3. The lower mold half 3 has a deformable coating on surface 6. Typically, the deformable coating is an elastically deformable coating which is preferably heat resistant and may be, for example, a silicone or fluorine based rubber coating, which is typically laminated onto the surface 6 of the lower mold half 3.

In use, the lead frame 7 with a semiconductor chip 9 attached to each die paddle 8 is inserted into the mold 1 and the mold halves 2, 3 are closed so as to clamp onto lead fingers 17 of the lead frame 7. When the lead frame 7 is located within the mold 1, as shown in FIG. 2, one mold cavity 4 surrounds each chip 9 and a hole 12 aligns with each die paddle 8. A vacuum is applied to the holes 12 in the lower mold half 3 to draw air through the holes 12 and out of the recess 5 below the die paddle 8. This causes the die paddle 8 to be sucked onto the coating on the surface 6 and the suction generates a sealing pressure between the bottom surface 18 of the die paddle 8 and the surface 6. Therefore, when molding material is injected into the mold cavity 4, the sealing pressure between the surface 18 and the surface 6 prevents or minimises seepage of molding compound between the surface 18 and the surface 6.

Figure 3:
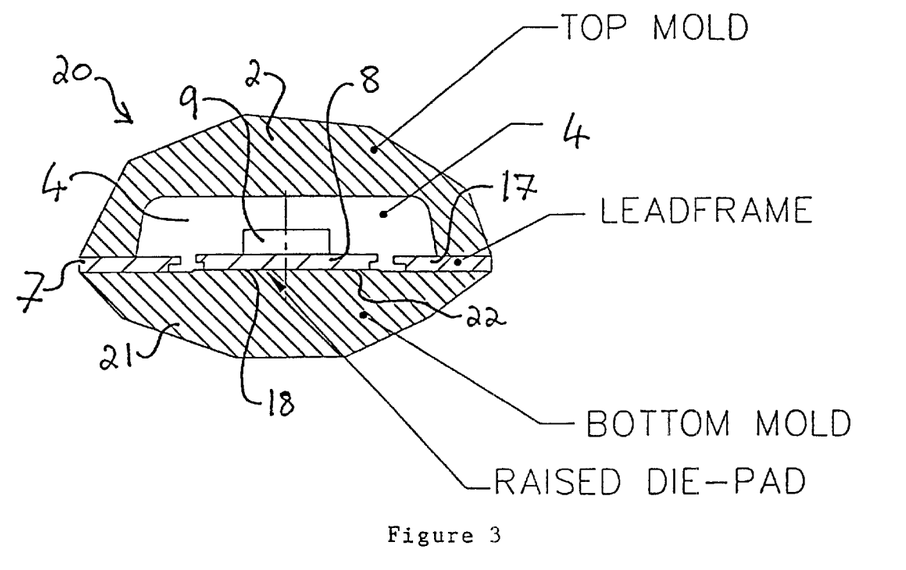
FIG. 3 is a cross-sectional view of a second example of a mold for a matrix QFN package.

FIG. 3 shows a second example of a mold 20 which includes an upper mold half 2 and a lower mold half 21. In this example, the lower mold half 21 does not have the vacuum holes 12 or the pocket 5. Instead, the lower mold half 21 has a raised surface 22 corresponding to the die paddle 8 of the lead frame 7. The raised surface 22 also has a deformable coating similar to the coating on the surface 6 in FIG. 2. When the mold halves 2, 3 are closed, the raised surface 22 forces the die paddle 8 upwards relative to the lead fingers 17. This force exerted by the raised surface 22 on the under surface 18 of the die paddle 8 generates sealing pressure between the surface 18 and the raised surface 22 to minimise seepage of molding material between the surface 18 and the raised surface 22.

Figure 4:
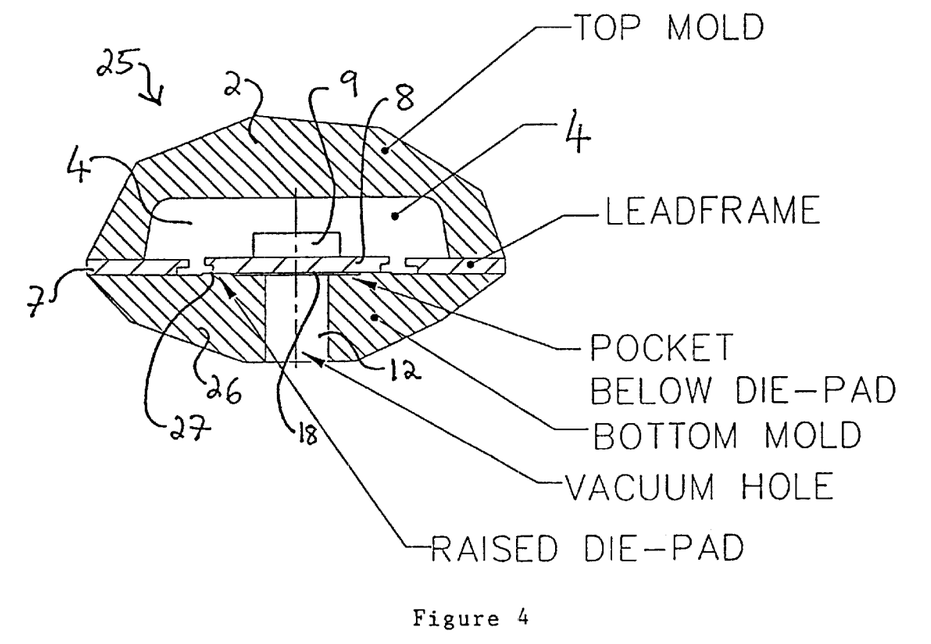
FIG. 4 is a cross-sectional view of a third example of a mold for a matrix QFN package.

FIG. 4 shows a third example of a mold 25 which combines the raised surface feature of the lower mold half 21 in FIG. 3 with the vacuum hole feature of the lower mold half 3 in FIG. 2 on a lower mold half 26. The lower mold half 26 includes a raised surface 27 with a coating similar to the coatings on the surfaces 6 and 22, and also including holes 12 below the die paddle 8 so that the sealing pressure between the lower surface 18 of the die paddle 8 and the surface 27 is generated by a combination of the raised surface 27 and the vacuum applied to the holes 12.

Figure 5:
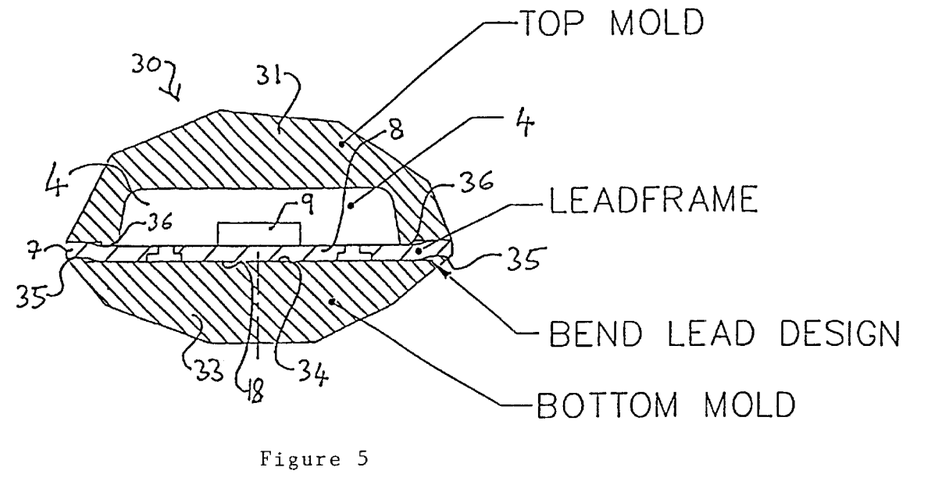
FIG. 5 is a cross-sectional view of a fourth example of a mold for a matrix QFN package.

A fourth example of a mold 30 is shown in FIG. 5. The mold 30 includes an upper mold half 31 and a lower mold half 33 which is similar to the lower mold half 21. However, the lower mold half 33 has a lowered central surface 34 surrounded by a raised edge 35 which cooperates with a lowered edge 36 on the upper mold half 31. Located between the mold halves 31, 33 is the lead frame 7 with the die paddle 8 on which the semiconductor chip 9 is attached. The lower surface 18 of the die paddle 8 is forced against a coating on the surface 34 by the lowered edge 36 pushing the central section of the lead frame 7, including the die paddle 8 against the lower mold half 33 so that the lower surface 18 is forced against the surface 34 of the lower mold half 33 to generate a sealing pressure to minimise seepage of molding material between the surfaces 18, 34 when molding material is injected into the cavity 4.

Figure 6:
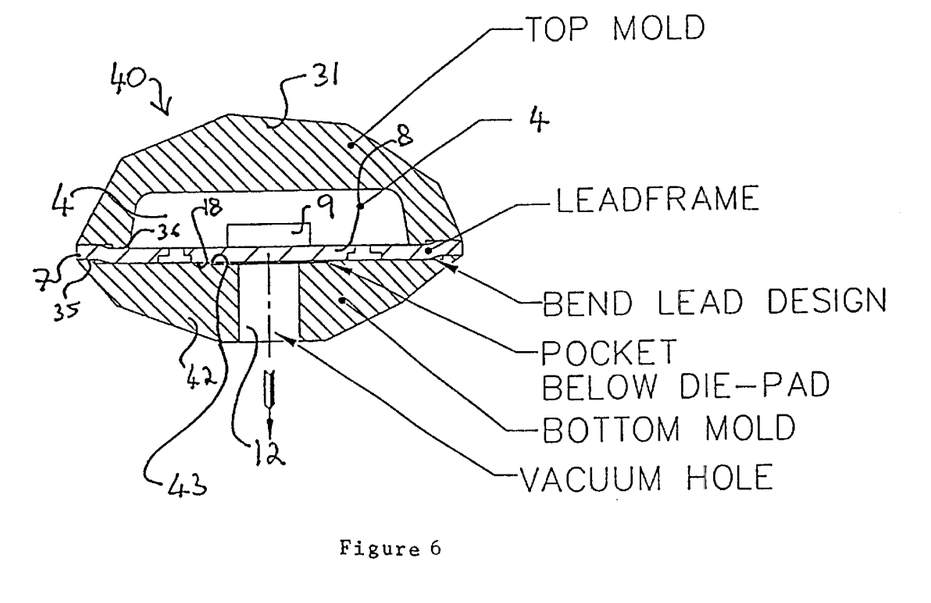
FIG. 6 is a cross-sectional view of a fifth example of a mold for a matrix QFN package.

FIG. 6 shows a fourth example of a mold 40 that includes an upper mold half 31 and a lower mold half 42. The lower mold half 42 is similar to the lower mold half 33 and also include a raised edge 35. However, the lower mold half 42 also includes vacuum holes 12. Hence, the sealing pressure between the lower surface 18 of the die paddle 8 and surface 43 of the insert 42 is generated by a combination of the lowered edge 36 pushing the central section of the lead frame 7 downwards towards the surface 43 and suction applied to the suction holes 12 sucking the surface 18 of a die paddle 8 onto the coating of the surface 43.

Figure 7:
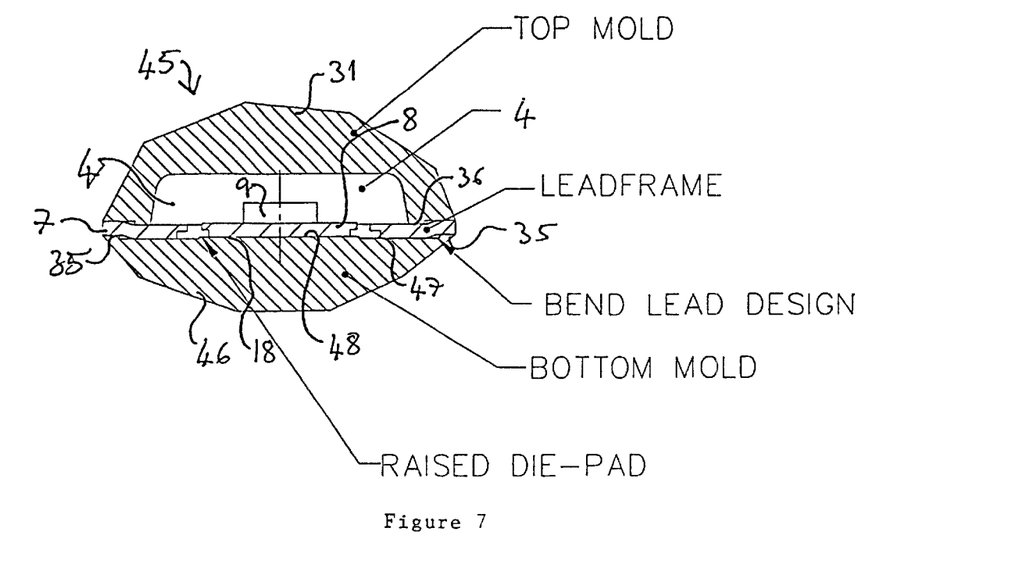
FIG. 7 is a cross-sectional view of a sixth example of a mold for a matrix QFN package.

FIG. 7 shows a sixth example of a mold 45 which includes the upper mold half 31 and a lower mold half 46. The lower mold half 46 is similar to the lower mold half 33 except that the lower mold half 46 also includes the raised surface feature of the lower mold half 21. Hence, the lower mold half 46 includes a raised edge 35 surrounding an inner surface 47 having a central raised surface 48. Therefore, the combination of the lower edge 36 pushing the inner section of a lead frame 7 downwards with the surface 48 pushing the die paddle upwards generates a sealing pressure between the surface 48 and surface 18 of the die paddle 8 to minimise seepage of molding material between the surfaces 18, 48 during molding.

Figure 8:
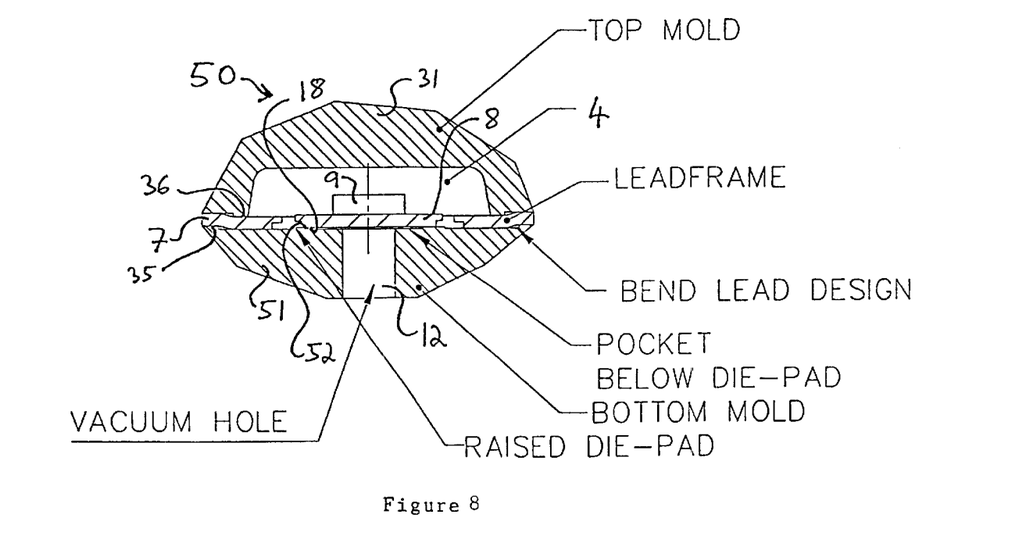
FIG. 8 is a cross-sectional view of a seventh example of a mold for a matrix QFN package.

FIG. 8 shows a seventh example of a mold 50 which includes the upper mold half 31 and a lower mold half 51. The lower mold half 51 is similar to the lower mold half 46, except that the lower mold half 51 also includes vacuum holes 12. Hence, the sealing pressure between the lower surface 18 of the die paddle 8 and surface 52 of the lower mold half 51 is generated in the same way as the sealing pressure generated in the mold 45, except that there is the additional use of suction applied to the holes 12 to suck the die paddle 8 towards the lower mold half 51, so that the under surface 18 of the die paddle 8 is sucked onto the coating material on the surface 52.

FIG. 9 is a plan view of a conventional lead frame 90 for a block QFN package. The lead frame 90 has a four separate blocks 91, and each block 91 has an array of 9×9 die paddles 92. In use, a semiconductor chip (not shown) is attached to each die paddle 92.

Figure 10:
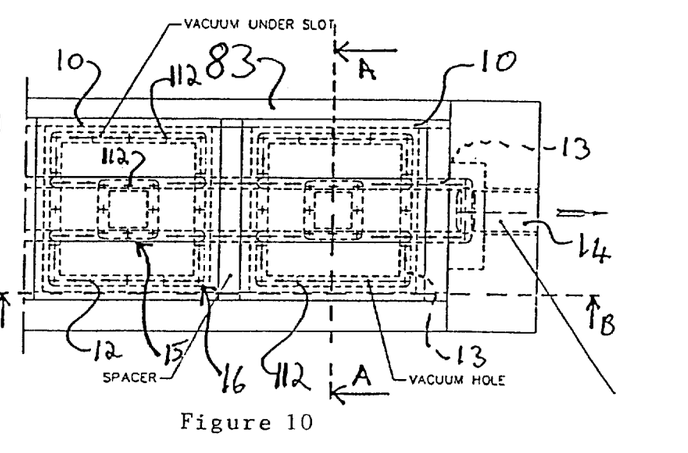
FIG. 10 is a plan view of part of a lower mold half for a block QFN package.
Figure 11:
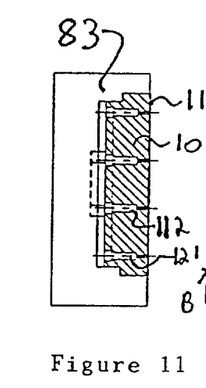
FIG. 11 is a cross-sectional view along the line AA of FIG. 10.
Figure 12:
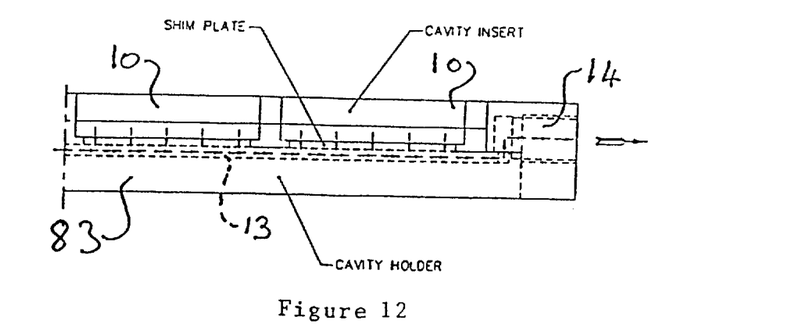
FIG. 12 is a cross-sectional view along the line BB of FIG. 10.

A lower mold half 83 for molding a molding material around chips attached to the lead frame 90 is shown in FIGS. 10 to 12. The lower mold half 83 includes a number of inserts 10 located in recesses in the lower mold half 83. Each insert 10 has a deformable coating 11 on its surface and corresponds to one block 91 of die paddles 92. Typically, the deformable coating 11 is an elastically deformable coating which is preferably heat resistant and may be, for example, a silicone or fluorine based rubber coating, which is typically laminated onto the surface of the cavity insert 10. Each cavity insert 10 has a number of holes 112 extending through the cavity insert 10 and the coating 11. The holes 112 are connected to passageways 13 within the lower mold half 83 which are in communication with a suction port 14. The suction port 14 can be coupled to a vacuum device (not shown) to suck air through the holes 112 via the passageways 13 and out of the port 14. The holes 112 are arranged as a set of inner holes 15 and a set of outer holes 16 so that the set of outer holes 16 are adjacent to the perimeter of a block 91 and the set of inner holes 15 are adjacent to the centre of the a block 91. This helps maintain a substantially uniform suction pressure across each block 91.

In use, the lead frame 90 is inserted into a mold including the lower mold half 83 with the attached dies on the opposite side of the lead frame to the inserts 10. The mold halves are then closed and suction is applied to the port 14 to suck the blocks 91 on to the coating 1 1 of the respective insert 10. When the molding material is injected into the mold, the suction force between each block 91 and the respective insert 10 helps minimise seepage of molding material onto the underside of the blocks 91 of the lead frame 90.

In all the above examples, the lead frames 7, 90 are standard QFN lead frames. However, flashing can be further minimised by using a modified QFN lead frame, as described below.

Figure 13:
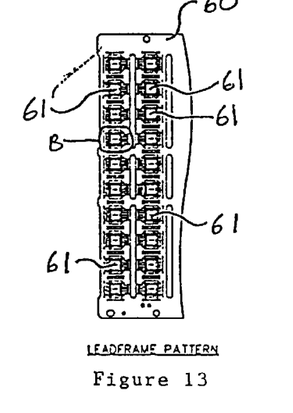
FIG. 13 is a bottom view of one half of a lead frame in accordance with the invention for a matrix QFN package.
Figure 14:
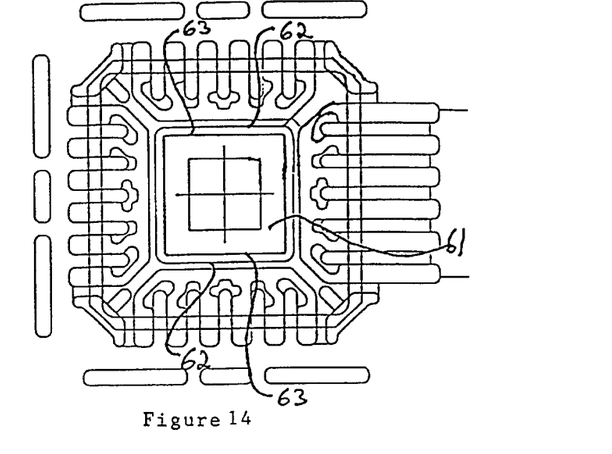
FIG. 14 is an enlarged view of the region B of FIG. 13 showing a first example of a die paddle.
Figure 15:
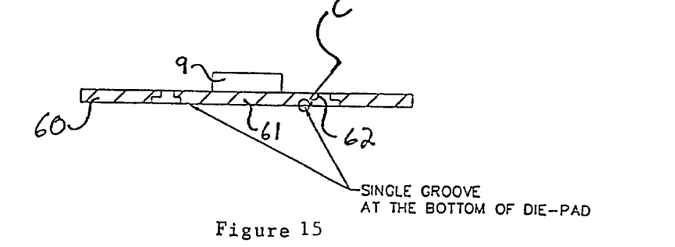
FIG. 15 is a cross-sectional view of the enlarged region B shown in FIG. 14.
Figure 16:
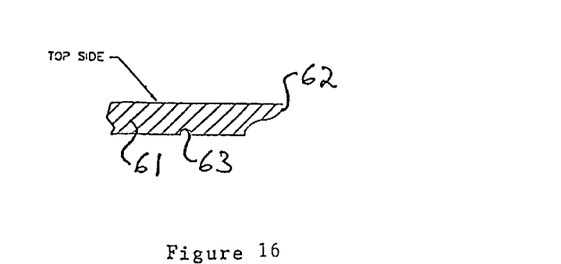
FIG. 16 is an enlarged view of region C in FIG. 13.

FIG. 13 is a plan view of a modified lead frame 60 for a matrix QFN package, which includes a number of die paddles 61. An enlarged view of one die paddle 61 is shown in FIG. 14 and a cross-sectional view shown in FIG. 15. The die paddle 61 has an outer edge 62 and located within the outer edge 62 (but adjacent to the outer edge 62) is a continuous groove 63 which is typically formed by etching of the lower surface of the die paddle 61. FIG. 16 shows an enlarged view of the section C in FIG. 15 which shows a cross-section of the groove 63 in more detail.

The inventors have found that the use of a groove 63 on the underside of the die paddle 61 acts to reduce flashing of molding material on the underside of the die paddle 61, especially when used in conjunction with the molds 1, 20, 25, 30, 40, 45, 50 shown in FIGS. 1 to 8 or the lower mold half 83 shown in FIGS. 9 to 12.

Figure 17:
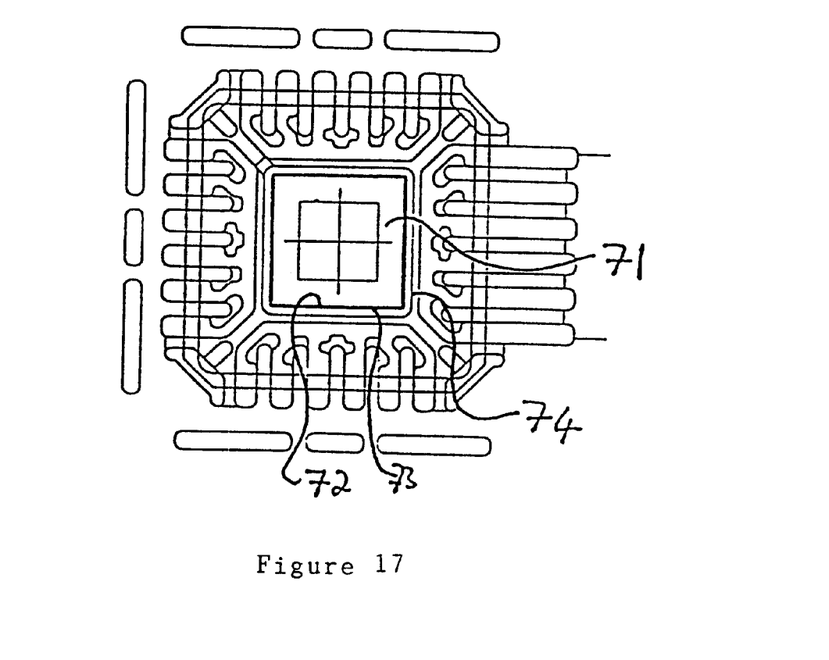
FIG. 17 is a view similar to FIG. 14 but showing a second example of a die paddle.
Figures 18, 19:
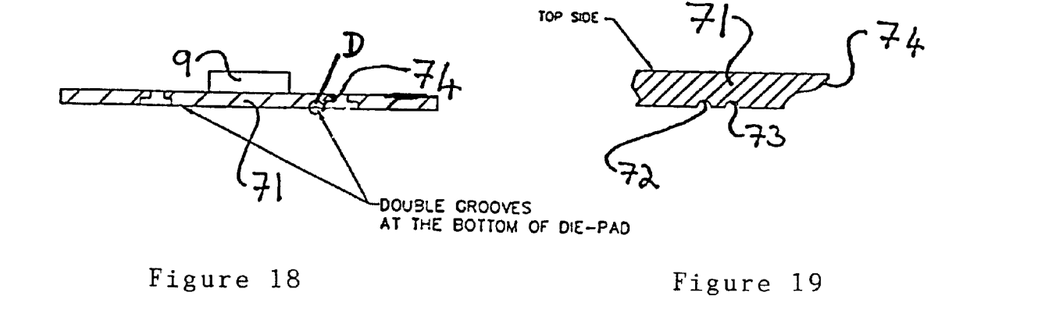
FIG. 18 is a cross-sectional view of FIG. 17.
FIG. 19 is an enlarged view of the region D shown in FIG. 18.

A second example of a die paddle 71, which can be used instead of the die paddle 61, is shown in FIGS. 17 to 19. The die paddle 71 is similar to the die paddle 61 except that two grooves 72, 73 are provided within the edge of the die paddle 74. As with the groove 61, the grooves 72, 73 are typically etched into the die paddle 71. Typically, the double grooves 72, 73 will have the advantage of further reducing flashing of the die paddle 71 compared to flashing of the die paddle 61.

As with the die paddle 61, the die paddle 71 is preferably used on a lead frame which is molded using one of the molds described above and shown in FIGS. 1 to 8 or a mold including the lower mold half shown in FIGS. 9 to 12.

The invention has the advantage that by generating a sealing pressure between the underside of the die paddle and a surface of the mold, and by providing a continuous recess on the underside of the die paddle, flashing of the underside of a die paddle can be reduced.

We claim:

1. A mold for a semiconductor chip comprising:

two mold halves, one mold half comprising a sealing mechanism constructed and configured to exert a sealing pressure between a surface of the mold and a surface of a substrate located in the mold; and an access open configured to deliver molding material into the mold during a molding operation.

2. A mold according to claim 1, wherein the mold surface contacting the surface of the substrate is compressible.

3. A mold according to claim 2, wherein the mold surface is elastically deformable.

4. A mold according to claim 1, wherein the sealing mechanism comprises at least one hole in the mold surface through which a suction force may be applied for holding the substrate directly to the mold surface.

5. A mold according to claim 1, wherein the sealing mechanism comprises:

a plurality of holes in the mold surface; and a coupler constructed and configured to connect the holes to a suction device.

6. A mold according to claim 5, wherein the holes are arranged such that there is a substantially uniform sealing pressure across the surfaces.

7. A mold according to claim 1, wherein the surface of the mold and the substrate are configured such that when the mold halves are closed, the surface of the substrate is forced against the surface of the mold to generate the sealing pressure.

8. A substrate for mounting a semiconductor chip thereon, the substrate comprising:

a mounting portion adapted to have a semiconductor chip mounted on a first surface of the mounting portion, and a second surface of the mounting portion, opposite the first portion, and wherein: the second surface includes a recess directly on, and extending continuously around the second surface, adjacent to and within the edge of the second surface.

9. A substrate according to claim 8, wherein there are two recesses extending around a periphery of the second surface, one recess being closer to the edge of the second surface than the other recess.

10. A substrate according to claim 9, wherein the recesses are spaced apart from each other.

11. A substrate according to claim 9, wherein the recesses are substantially parallel to each other.

12. A substrate according to claim 8, wherein the substrate is a lead frame.

13. A substrate according to claim 8, wherein the substrate is a metal material.

* * * * *

UNITED STATES PATENT AND TRADEMARK OFFICE
CERTIFICATE OF CORRECTION

PATENT NO. : 6,674,165 B2 Page 1 of 1
DATED : January 6, 2004
INVENTOR(S) : Ho et al.

It is certified that error appears in the above-identified patent and that said Letters Patent is hereby corrected as shown below:

<u>Title page,</u>
Item [75], Inventors, "Srikanth Narasimulau" should read -- Srikanth Narasimalu --.

Signed and Sealed this

Twenty-second Day of June, 2004

JON W. DUDAS
*Acting Director of the United States Patent and Trademark Office*